(12) United States Patent
Sata

(10) Patent No.: US 9,153,769 B2
(45) Date of Patent: Oct. 6, 2015

(54) MULTI-LAYER PIEZOELECTRIC ELEMENT, AND INJECTION DEVICE AND FUEL INJECTION SYSTEM PROVIDED THEREWITH FOR ENHANCED DURABILITY

(75) Inventor: Tetsuro Sata, Kirishima (JP)

(73) Assignee: Kyocera Corporation, Kyoto (JP)

( * ) Notice: Subject to any disclaimer, the term of this patent is extended or adjusted under 35 U.S.C. 154(b) by 820 days.

(21) Appl. No.: 13/392,320

(22) PCT Filed: Aug. 26, 2010

(86) PCT No.: PCT/JP2010/064480
§ 371 (c)(1),
(2), (4) Date: Apr. 11, 2012

(87) PCT Pub. No.: WO2011/024894
PCT Pub. Date: Mar. 3, 2011

(65) Prior Publication Data
US 2012/0187213 A1  Jul. 26, 2012

(30) Foreign Application Priority Data
Aug. 27, 2009 (JP) ................ 2009-196349

(51) Int. Cl.
*H01L 41/083* (2006.01)
*H01L 41/337* (2013.01)
(Continued)

(52) U.S. Cl.
CPC ......... *H01L 41/337* (2013.01); *F02M 51/0603* (2013.01); *H01L 41/0838* (2013.01); *H01L 41/273* (2013.01); *H01L 41/1875* (2013.01)

(58) Field of Classification Search
USPC ................................. 310/328, 365
See application file for complete search history.

(56) References Cited

U.S. PATENT DOCUMENTS 7,326,309 B2  2/2008  Sato et al.
2002/0152857 A1  10/2002  Sato et al.
(Continued)

FOREIGN PATENT DOCUMENTS

DE  102005023370 A1  11/2006
EP  1453114 A2  1/2004
(Continued)

OTHER PUBLICATIONS

Chinese Office Action, Chinese Patent Application No. 201080036575.9, with a concise explanation in English, Sep. 29, 2013, 8 pp.

*Primary Examiner* — J. San Martin
(74) *Attorney, Agent, or Firm* — Volpe and Koenig, P.C.

(57) ABSTRACT

A center of a multi-layer piezoelectric element is an active region and deforms to a greater degree than ends thereof which is an inactive region during driving operation, and is therefore more susceptible to stress concentration and crack development. To address this problem, a multi-layer piezoelectric element includes a columnar stacked body in which piezoelectric layers and internal electrode layers are alternately laminated, and a pair of external electrodes configured to bond to side faces of the columnar stacked body, wherein a side face of the columnar stacked body is configured so that a surface roughness of a center of the side face in a stacked direction of the columnar stacked body is greater than those of ends of the side face in the stacked direction of the columnar stacked body. This makes it possible to relax the stress exerted on the side face of the columnar stacked body, and thereby enhance the durability of the multi-layer piezoelectric element.

5 Claims, 5 Drawing Sheets

(51) Int. Cl.
*F02M 51/06* (2006.01)
*H01L 41/273* (2013.01)
*H01L 41/187* (2006.01)

(56) References Cited

U.S. PATENT DOCUMENTS

| | | |
|---|---|---|
| 2002/0157756 A1 | 10/2002 | Sato et al. |
| 2004/0134049 A1 | 7/2004 | Schreiner et al. |
| 2004/0169442 A1* | 9/2004 | Senoo et al. .................. 310/328 |
| 2004/0185278 A1 | 9/2004 | Sato |
| 2005/0046312 A1* | 3/2005 | Miyoshi ........................ 310/366 |
| 2007/0200109 A1 | 8/2007 | Sciortino et al. |
| 2010/0276510 A1 | 11/2010 | Setoguchi et al. |
| 2010/0320283 A1 | 12/2010 | Sata et al. |
| 2010/0326405 A1* | 12/2010 | Nakamura .................... 123/498 |
| 2011/0155822 A1* | 6/2011 | Sata ........................... 239/102.2 |
| 2013/0220515 A1 | 8/2013 | Setoguchi et al. |

FOREIGN PATENT DOCUMENTS

| | | |
|---|---|---|
| JP | 2001339105 | 12/2001 |
| JP | 2002370217 | 12/2002 |
| JP | 200317779 | 1/2003 |
| JP | 2007251150 | 9/2007 |
| WO | 2009041476 A1 | 4/2009 |
| WO | 2009069693 A1 | 6/2009 |

* cited by examiner

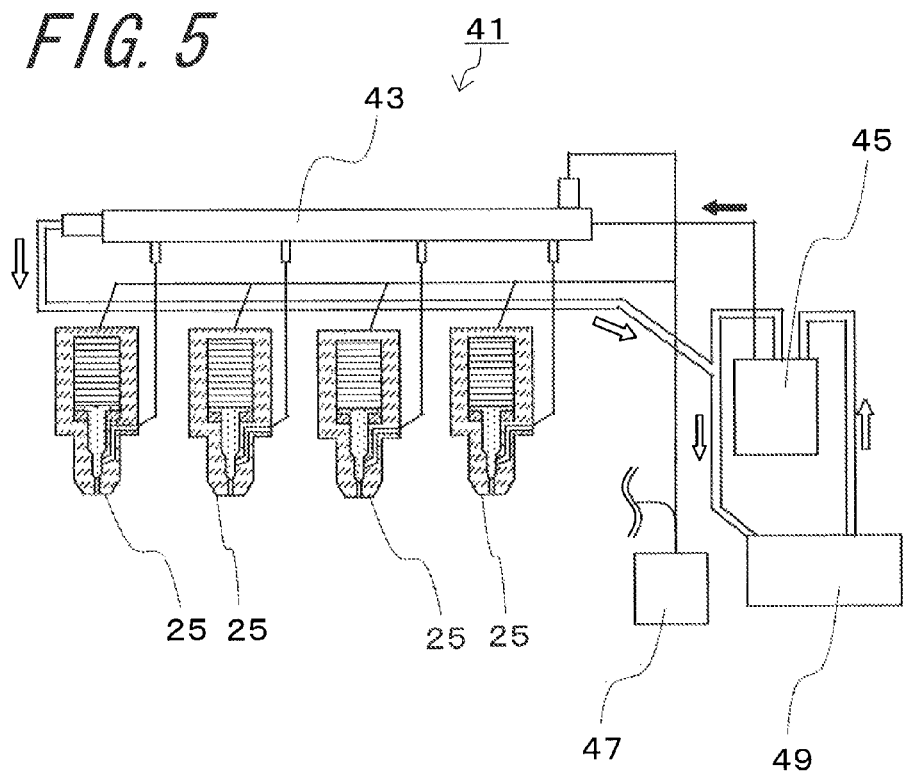

MULTI-LAYER PIEZOELECTRIC ELEMENT, AND INJECTION DEVICE AND FUEL INJECTION SYSTEM PROVIDED THEREWITH FOR ENHANCED DURABILITY

TECHNICAL FIELD

The present invention relates to a multi-layer piezoelectric element employing a stacked body in which piezoelectric layers and internal electrode layers are alternately laminated, and also to an injection device, as well as a fuel injection system, which are provided with the multi-layer piezoelectric element.

BACKGROUND ART

A multi-layer piezoelectric element comprises: a stacked body in which a plurality of piezoelectric layers and a plurality of internal electrode layers each interposed between the piezoelectric layers are alternately laminated; and an external electrode formed on a side face of the stacked body where the internal electrode layers are led out.

A method for manufacturing the multi-layer piezoelectric element comprises printing an electrically conductive paste for forming the internal electrode layers onto ceramic green sheets that are to be formed into the piezoelectric layers following firing process; forming a stacked compact by laminating the plurality of ceramic green sheets bearing the electrically conductive paste on top of each other in layers; forming a stacked body by firing the stacked compact; grinding a side face of the stacked body in a direction parallel to a stacked direction of the stacked body, or in any given direction for outer shape adjustment; erasing grinding marks by means of blasting or otherwise to finish the article off with great precision in shape; and forming an external electrode so that it is connected to the internal electrode layer led out to the side face of the stacked body. In the multi-layer piezoelectric element thereby produced, the grinding-processed stacked body has a uniform roughness throughout its side.

CITATION LIST

Patent Literature

Patent Literature 1: Japanese Unexamined Patent Publication JP-A 2007-251150

SUMMARY OF INVENTION

Technical Problem

In recent years, multi-layer piezoelectric elements have been required to withstand operation under harsh conditions, in particular, long-time continuous driving operation under high-voltage and high-pressure conditions, which has resulted in an increasing demand for further improvement in durability. In this regard, a side face of a stacked body in a conventional-type multi-layer piezoelectric element has a uniform surface roughness, but still a center of the stacked body, being an active region, is easier to extend during driving operation than an end thereof that is an inactive region. Accordingly, in the stacked body in an operative condition, the center becomes deformed at its side face more greatly than does the end, and is therefore more susceptible to stress concentration. Once the stacked body has incurred a flaw at the side face of its center, the flaw gives rise to development of a crack. This leads to the difficulty in driving the multi-layer piezoelectric element continuously for a long period of time with stability.

The invention has been devised in view of the problem associated with the conventional art as mentioned supra, and accordingly an object of the invention is to provide a multi-layer piezoelectric element that succeeded in enhancement of durability by suppressing crack development in a stacked body effectively through the control of a surface roughness of a side face of the stacked body. Further, an object of the invention is to provide an injection device, as well as a fuel injection system, which are provided with the multi-layer piezoelectric element for enhanced durability.

Solution to Problem

The invention provides a multi-layer piezoelectric element, comprising: a columnar stacked body in which piezoelectric layers and internal electrode layers are alternately laminated; and a pair of external electrodes configured to bond to side faces of the columnar stacked body so as to make connection with the internal electrode layers, wherein a side face of the columnar stacked body is configured so that a surface roughness of a center of the side face in a stacked direction of the columnar stacked body is greater than those of ends of the side face in the stacked direction of the columnar stacked body.

Moreover, in the multi-layer piezoelectric element of the invention, it is preferable that the columnar stacked body includes an active region located in the center in the stacked direction where each of the piezoelectric layers is sandwiched between the internal electrode layers, and an inactive region located in the ends where each of the piezoelectric layers is not sandwiched between the internal electrode layers, and the side face of the columnar stacked body is configured so that a surface roughness in the active region is greater than that in the inactive region.

Moreover, in the multi-layer piezoelectric element of the invention, it is preferable that the columnar stacked body comprises processing streaks left on the center of the side face so as to extend in parallel with the piezoelectric layers and the internal electrode layers.

Moreover, in the multi-layer piezoelectric element of the invention, it is preferable that the side face of the columnar stacked body is coated with a resin in a range from the center to the ends.

The invention provides an injection device, comprising: a container comprising an injection hole; and the multi-layer piezoelectric element mentioned above, wherein a liquid filled in the container is configured to be injected through the injection hole by driving the multi-layer piezoelectric element.

The invention provides a fuel injection system, comprising: a common rail configured to store a high-pressure fuel; the injection device mentioned above, configured to inject the high-pressure fuel stored in the common rail; a pressure pump configured to supply the high-pressure fuel to the common rail; and an injection control unit configured to send a drive signal to the injection device.

Advantageous effects of Invention

According to the invention, the multi-layer piezoelectric element comprises: the columnar stacked body in which piezoelectric layers and internal electrode layers are alternately laminated; and a pair of external electrodes configured to bond to side faces of the columnar stacked body so as to make connection with the internal electrode layers. A side face of the columnar stacked body is configured so that a surface roughness of a center of the side face in a stacked direction of the columnar stacked body is greater than those of ends of the side face in the stacked direction of the columnar stacked body. That is, the side face of the columnar stacked body is ground in such a way that the center has a rough side face, whereas the ends have a fine side face. The side face of the columnar stacked body, bearing surface asperities of piezoelectric particles in an unclamped state, is prone to deformation under a stress and is therefore likely to extend during driving operation of the multi-layer piezoelectric element. This makes it possible to relax the stress exerted on the side face of the columnar stacked body, and thereby enhance the durability of the multi-layer piezoelectric element.

Moreover, according to the multi-layer piezoelectric element of the invention, the columnar stacked body includes the active region located in the center thereof in the stacked direction where each of the piezoelectric layers is sandwiched between the internal electrode layers, and the inactive region located in the ends where each of the piezoelectric layers is not sandwiched between the internal electrode layers, and the side face of the columnar stacked body is configured so that a surface roughness in the active region is greater than that in the inactive region. In this case, since the asperities at the side face of the active region which becomes deformed during driving operation are larger in dimension than those at the side face of the inactive region, it is possible to relax the stress exerted on the active region located in the center of the side face of the stacked body in the stacked direction in the course of driving operation, with the consequent enhancement in durability.

Moreover, according to the multi-layer piezoelectric element of the invention, the columnar stacked body has processing streaks left on the center of the side face so as to extend in parallel with the piezoelectric layers and the internal electrode layers. In this case, it is possible to effectively suppress short-circuiting between the adjacent internal electrode layers caused in the presence of asperities derived from the processing streaks, and thus protect the internal electrode layers of different polarities against short-circuiting, with the consequent enhancement of the durability of the multi-layer piezoelectric element.

Moreover, according to the multi-layer piezoelectric element of the invention, the side face of the columnar stacked body is coated with a resin in a range from the center to the ends. In this case, since the ends having a fine side face can be coated with a resin with good adherability, it is possible to effectively suppress short-circuiting between the internal electrode layers caused by the intrusion of moisture, with the consequent improvement of the service life of the multi-layer piezoelectric element.

According to the invention, the injection device comprises: the container comprising an injection hole; and the multi-layer piezoelectric element of the invention. In this construction, a liquid filled in the container is configured to be injected through the injection hole by driving the multi-layer piezoelectric element. With the provision of the highly durable multi-layer piezoelectric element of the invention, the injection device excels in durability.

According to the invention, the fuel injection system comprises: the common rail configured to store a high-pressure fuel; the injection device mentioned above, configured to inject the high-pressure fuel stored in the common rail; the pressure pump configured to supply the high-pressure fuel to the common rail; and the injection control unit configured to send a drive signal to the injection device. In this way, the injection device incorporating the highly durable multi-layer piezoelectric element of the invention is employed for the fuel injection system, so that the fuel injection system excels in durability.

BRIEF DESCRIPTION OF DRAWINGS

FIG. 5 is a schematic block diagram showing an example of a fuel injection system according to an embodiment of the invention.

DESCRIPTION OF EMBODIMENTS

Hereinafter, examples of a multi-layer piezoelectric element according to an embodiment the invention will be described in detail with reference to the drawings.

Figure 1:
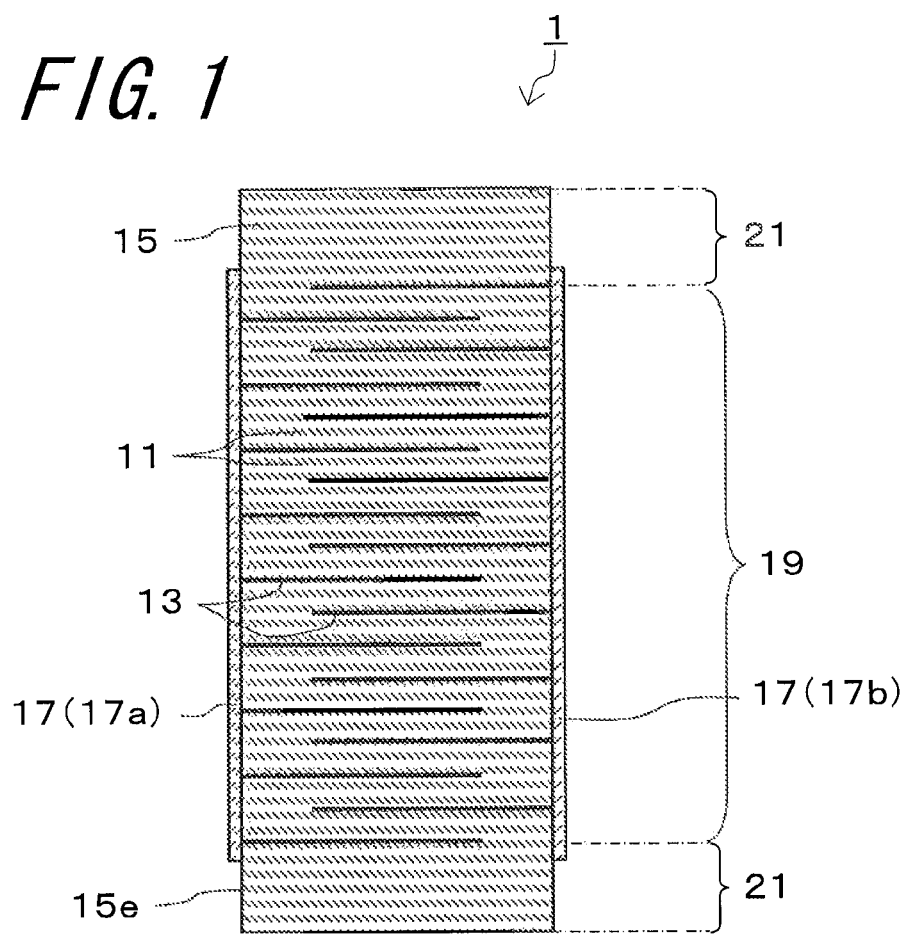
FIG. 1 is a side view showing an example of a multi-layer piezoelectric element according to an embodiment of the invention.

FIG. 1 is a side view showing an example of the multi-layer piezoelectric element according to an embodiment of the invention.

In this example, the multi-layer piezoelectric element 1 comprises: a columnar stacked body 15 in which piezoelectric layers 11 and internal electrode layers 13 are alternately laminated; and a pair of external electrodes 17 (17a and 17b) configured to bond to side faces of the columnar stacked body 15 so as to make connection with the internal electrode layers 13. A side face of the columnar stacked body 15 is configured so that a surface roughness of a center of the side face in a stacked direction of the columnar stacked body 15 is greater than those of ends of the side face in the stacked direction of the columnar stacked body 15.

According to such a multi-layer piezoelectric element 1, the side face of the columnar stacked body 15 shaped like a rectangular column is configured so that the surface roughness of the center of the side face is greater than those of the ends of the side face. In contrast to the ends having a fine side face, the center is prone to deformation under a stress developed in the course of driving operation, and is therefore easily deformed for extension and contraction during driving operation. This makes it possible to relax the stress exerted on the center (preferably, an active region 19 which will hereafter be described) which becomes deformed during driving operation. It is also possible to relax the stress exerted on the boundary between the center corresponding to the active region 19 and an inactive region 21 located at the end which remains undeformed during driving operation. Where the surface roughness of the side face of the columnar stacked body 15 in the shape of a rectangular column is concerned, by imparting a fine surface roughness to the inactive region 21 located at the ends, the inactive region 21, which is free from deformation during driving operation, is able to exhibit higher strength, with the consequent attainment of high durability.

In the multi-layer piezoelectric element 1, amongst the side faces of the stacked body 15, the ones taken as a pair, to each of which are led out the internal electrode layers 13, are formed with the external electrodes 17 taken as a pair (a negative external electrode 17a and a positive external electrode 17b), respectively, for connection with their respective internal electrode layers 13. In this construction, the stacked body 15 includes the active region 19 where the internal electrode layers 13 are opposed to each other, with the piezoelectric layer 11 lying therebetween, and the inactive region 21 located at each end of the active region 19 in the stacked direction, where no internal electrode layer 13 is interposed between the piezoelectric layers 11. The active region 19 is an activated part where the piezoelectric layer 11 undergoes extension or contraction in the stacked direction during driving operation. On the other hand, the inactive region 21 is an inactivated part where the piezoelectric layer 11 undergoes neither extension nor contraction in the stacked direction during driving operation. That is, the inactive region 21 is a part devoid of opposed arrangement of the internal electrode layers 13 conducive to driving operation under application of a driving voltage, which in itself is not driven to activate (inactivated part). The inactive region 21 may be made to contain a metal layer or the like so long as it does not serve as the internal electrode layer 13.

The piezoelectric layer 11 is made of a material such for example as piezoelectric ceramics composed predominantly of lead zirconate titanate ($PbZrO_3$—$PbTiO_3$:PZT), and has a thickness in a range of about 30 μm to 200 μm. Moreover, the internal electrode layer 13 is made for example of a fired product of metal powder such as silver-palladium (Ag—Pd), and has a thickness in a range of about 1 μm to 5 μm.

The external electrode 17 is made for example of a fired product of silver powder and glass powder. The external electrode 17 is so formed as to cover a part of the active region 19 where the internal electrode layers 13 are led out, as well as to make connection with the internal electrode layers 13. The thickness of the external electrode 17 falls in a range of about 10 μm to 50 μm.

The side faces of the columnar stacked body 15 are ground to the desired degrees of surface roughness by means of a combination of abrasive stones of different grain sizes in such a way that the surface roughness of the center of the side face in the stacked direction is greater than those of the ends of the side face in the stacked direction, for example, in such a way that a fine-grained abrasive stone of high count is used for one-sixth part of the entire side length in the stacked direction corresponding to the ends, whereas a coarse-grained abrasive stone of low count is used for two-thirds part of the entire side length in the stacked direction corresponding to the center. Meanwhile, in the case of using abrasive stones of the same count, the difference in surface roughness can be obtained by making changes to grinding conditions or the material composition of the piezoelectric layer 11. At this time, the grinding process is carried out in such a way that grinding streaks left by the abrasive stone extend along the internal electrode layer 13 within the range of the side face of the stacked body 15.

In the multi-layer piezoelectric element 1 of the invention, depending upon the grinding conditions including the counts of abrasive stones used to grind the side face of the columnar stacked body 15 or the speed of rotation of the columnar stacked body 15 as well as the abrasive stone during grinding process, the grinding pressure exerted by the abrasive stone, and the materials of construction of the columnar stacked body 15 and the abrasive stone, it is preferable that the surface roughness of the side face of the columnar stacked body 15 is adjusted so that, in terms of arithmetic average roughness Ra, the roughness of the ends corresponding to the inactive region 21 is 0.4 μm or less, and that of the center corresponding to the active region 19 is 0.45 μm or more, with the difference in surface roughness between the ends and the center of the side face maintained at 0.05 μm or more. More preferably, the surface roughness of the end is 0.3 μm or less in terms of arithmetic average roughness Ra. By making surface-roughness adjustment in that way, it is possible to relax the stress exerted on the active region 19 which becomes deformed during driving operation. Moreover, by grinding the stacked body in such a way that its side face becomes finer gradually from the center to the ends, it is possible to eliminate localized stress concentration, and thereby achieve more effective stress relaxation. Further, in the case where the side face of the columnar stacked body 15 having such a surface roughness is coated with a resin (not represented graphically) in the range from the center to the ends, the end, having a finer surface than the center, can be coated with a resin with better adherability. This makes it possible to effectively suppress intrusion of moisture into the interface between the columnar stacked body 15 and the resin, and thereby protect the internal electrode layers 13 against short-circuiting resulting from the intrusion of moisture, with the consequent improvement of the service life of the multi-layer piezoelectric element 1. Note that, although the side face of the end of the columnar stacked body 1 corresponds to the inactive region 21, it may include part of the active region 19. Nearly one-sixth part of the entire side length located toward the upper or lower end face of the columnar stacked body 15 corresponds to the end, whereas the other nearly two-thirds part of the entire side length corresponds to the center.

It is essential only that the resin, by which the side face of the columnar stacked body 15 is covered in the range from the center to the ends, is applied to, of the side faces of the stacked body, at least the ones connected with their respective paired external electrodes 17. It will be found desirable, however, to coat the resin on all of the side faces, namely, the entire periphery of the columnar stacked body 15. This makes it possible to effectively suppress coming of moisture through the region between the piezoelectric layers 11 at the internal electrode layers 13, and thereby protect the internal electrode layers 13 against quality degradation.

At this time, the center of the columnar stacked body 15, being deformed to a larger extent during driving operation, is made to have surface asperities of larger dimension for enhancement of the stress relaxation effect. Moreover, by grinding the columnar stacked body 15 in such a way that its side face becomes finer gradually from the center to the ends, it is possible to eliminate localized stress concentration during driving operation.

It is also advisable that, of the side face of the columnar stacked body 15, a part connecting the active region 19 and the inactive region 21 is so ground that its surface becomes finer gradually from the active region 19 to the inactive region 21. This makes it possible to relax the stress exerted on the boundary between the active region 19 which becomes deformed during driving operation and the inactive region 21 which remains undeformed during driving operation, and thereby attain even higher durability.

Moreover, the internal electrode layer 13 is so disposed as to be exposed at the side face of the columnar stacked body 15. This makes it possible to impart surface asperities to the side face of the columnar stacked body 15 by exploiting the difference in level at the edges of the internal electrode layer 13 and the piezoelectric layer 11, and thereby enhance the stress relaxation effect. Besides, in the presence of surface asperities of the side face of the columnar stacked body 15, creeping discharge is less likely to occur between the internal electrode layers 13 of different polarities.

Moreover, in the case of adjusting the surface roughness of the side face of the columnar stacked body 15 by grinding process, it is preferable that grinding streaks left at the side face of the columnar stacked body 15 as the result of grinding are in a state of extending in parallel with the internal electrode layer 13. This makes it possible to substantially suppress occurrence of cracking that could cause accidental joining together of the adjacent internal electrode layers 13 at the side face of the columnar stacked body 15.

In the production of the columnar stacked body 15 having such a surface roughness of the side face thereof, as grinding conditions, with use of a grinding tool which is mounted in movable relation toward and away from the side face of the columnar stacked body 15 for turning motion to grind the entire periphery of the columnar stacked body 15, grinding is carried out by operating the grinding tool to move forward and backward in conformity with the contour of the columnar stacked body 15.

At this time, where the grinding tool is concerned, it is advisable that the abrasive stone assigned to the side face of the end of the columnar stacked body 15 is smaller in grain size than the abrasive stone assigned to the center. In the alternative, the difference in surface roughness at the side face of the columnar stacked body 15 can be obtained also by making changes to the grinding conditions, the material compositions of the abrasive stones, and so forth.

In the manufacture of the multi-layer piezoelectric element 1 according to the present example, it is advisable that a side face of the columnar stacked body 15 in the shape of a rectangular column in which the piezoelectric layers 11 and the internal electrode layers 13 are alternately laminated, is ground by the abrasive stone-equipped grinding tool while being rotated about its lengthwise axis, with its opposite ends held in position.

In the manufacture of such a multi-layer piezoelectric element 1, it is preferable that the grinding tool is mounted in movable relation toward and away from the side face of the columnar stacked body 15 in a rotating state for the sake of grinding the entire periphery of the columnar stacked body 15.

In this way, the grinding streaks extending in parallel with the internal electrode layer 13 can be rendered substantially uniform in depth throughout the entire periphery of the columnar stacked body 15. This makes it possible to effectively suppress occurrence of short-circuiting between the adjacent internal electrode layers 13 at the side face of the columnar stacked body 15, and thereby impart even higher durability to the multi-layer piezoelectric element 1.

Next, an example of a method for manufacturing the multi-layer piezoelectric element 1 according to an embodiment of the invention will be particularized.

To begin with, ceramic green sheets for forming the piezoelectric layers 11 are produced. Specifically, calcined powder of piezoelectric ceramics, a binder made of an organic high polymer such as acrylic polymer or butyral polymer, and a plasticizer are mixed to prepare a slurry. The slurry is shaped into ceramic green sheets by a tape casting method such as the heretofore known doctor blade method or calendar roll method. The piezoelectric ceramics may be of any given type so long as it has piezoelectric property, and, for example, a perovskite-type oxide such as $PbZrO_3$—$PbTiO_3$ (PZT) can be used. Moreover, as the plasticizer, DBP (dibutyl phthalate), DOP (dioctyl phthalate), or the like can be used.

Next, an electrically conductive paste for forming the internal electrode layer 13 is produced. Specifically, the electrically conductive paste is prepared by admixing a binder, a plasticizer, and so forth in metal powder of, for example, silver-palladium (Ag—Pd). The electrically conductive paste is printed onto the aforementioned ceramic green sheet in a predetermined pattern by means of screen printing or otherwise. Then, a plurality of ceramic green sheets bearing the conductive-paste patterns are laminated on top of each other, and this stacked compact is subjected to firing process. In this way, there is obtained a columnar stacked body 15 having an active region 19 in which piezoelectric layers 11 and internal electrode layers 13 are alternately laminated.

At this time, a plurality of electrically conductive paste-printed ceramic green sheets are laminated on top of each other, and this laminate is dried into an unfired stacked compact. Then, a plurality of printed conductive paste-free ceramic green sheets are laminated on top of each other at each of the opposite ends of the unfired stacked compact in the stacked direction so as to form an inactive region 21 of the firing-treated columnar stacked body 15. The unfired stacked compact may be cut into the desired shape on an as needed basis.

Next, the stacked compact is subjected to debinding treatment, or binder removal treatment at a predetermined temperature, and is whereafter fired at a temperature in a range of 900° C. to 1150° C., for example. In this way, there is obtained the columnar stacked body 15.

It is noted that the columnar stacked body 15 may be formed with, in place of part of the internal electrode layers 13, a plurality of layers that are to be ruptured. In this case, the piezoelectric layers 11 and the internal electrode layers 13 are sandwiched between the adjacent to-be-ruptured layers. For example, the to-be-ruptured layer is formed of a porous layer containing many independent metal particles. In order to obtain such a porous layer, a few ways will be considered, i.e. adding carbon powder to an electrically conductive paste and firing the paste thereupon the carbon powder vanish away, patterning an electrically conductive paste so that it assumes a pattern of dots in printing process, and performing dry ice blasting or the like process on an electrically conductive paste that has undergone printing and drying process to roughen its printed surface.

Moreover, the following method can be adopted to make the to-be-ruptured layer a porous layer. There are prepared two electrically conductive pastes having different proportions of metallic components, of which one is for the to-be-ruptured layer in the form of a porous layer and the other is for the internal electrode layer 13. In the process of firing these electrically conductive pastes, diffusion of metallic components from the to-be-ruptured layer to the internal electrode layer 13 is effected by exploiting the difference in metallic-component concentration between them. Especially in the case where, with use of electrically conductive pastes composed predominantly of silver-palladium, the paste for the to-be-ruptured layer in the form of a porous layer is made higher in silver concentration than the paste for the internal electrode layer 13, during firing process, the silver is able to form a liquid phase and is allowed to move readily between piezoelectric particles constituting the piezoelectric layer 11. This is desirable for the formation of a to-be-ruptured layer in the form of a porous layer with a high degree of evenness.

Next, the side faces of the columnar stacked body 15 are ground. FIG. 2(a) is a schematic side view showing a grinding procedure adopted in an example of the method for manufacturing the multi-layer piezoelectric element according to an embodiment of the invention, and FIG. 2(b) is a schematic perspective view thereof. As shown in FIG. 2(a), the columnar stacked body 15 is, at its opposite end faces 15a and 15b, held by retainers 61a and 61b under pressure. At this time, the end faces 15a and 15b of the columnar stacked body 15 are each pressurized in a direction toward the center of the columnar stacked body 15. In this way, the side faces of the columnar stacked body 15 are ground by a grinding tool (abrasive stone 63) while being rotated about its lengthwise axis.

As shown in FIG. 2(b), the grinding tool (abrasive stone 63) is of a combination of a coarse-grained abrasive stone of low count and a fine-grained abrasive stone of high count, of which the former is for the center and the latter is for the ends. On the other hand, when it is desired to cause a difference in surface roughness between the center and the ends of the side face of the columnar stacked body 15 on the basis of grinding conditions, for example, an increase in the depth of cut set for the grinding tool (abrasive stone 63) allows the difference to be obtained. That is, of the columnar stacked body 15, the center becomes deformed in the direction for moving it away from the abrasive stone 63, whereas the opposite ends remain undeformed, wherefore the center is pressed firmly against the abrasive stone so as to have a rough surface, whereas the end is pressed gently against it so as to have a fine surface. Thus, it is possible to cause the difference in surface roughness.

Moreover, in grinding the side faces of the columnar stacked body 15, the abrasive stone 63 may be rotated, rather than the columnar stacked body 15 in itself. In this case, firstly, the abrasive stone 63 is brought into contact with one of the side faces of the columnar stacked body 15 for grinding. Following the completion of grinding on said side face, a ridge between said side face and a succeeding side face is chamfered or rounded with a gradual change of the angle of rotation of the columnar stacked body 15, and whereafter the succeeding side is subjected to grinding process. All of the side faces and ridges are worked likewise. In this way, at each and every side face of the columnar stacked body 15, the grinding streaks are left so as to extend in parallel with the internal electrode layer 13, and the center becomes greater in surface roughness than the ends.

Figure 2:
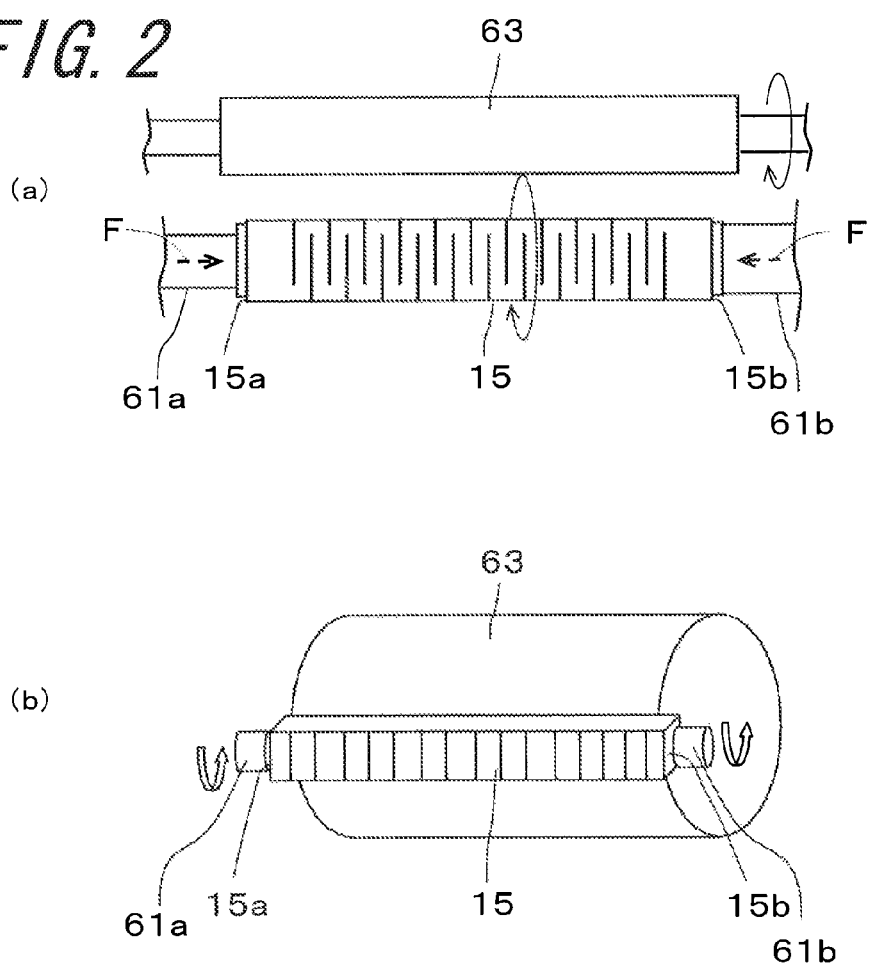
FIG. 2(a) is a schematic side view showing a grinding step adopted in an example of a method for manufacturing the multi-layer piezoelectric element according to an embodiment of the invention.
FIG. 2(b) is a schematic perspective view thereof.

While, in the example shown in FIG. 2, the abrasive stone 63 has the shape of a rectangular column having substantially the same length as that of the columnar stacked body 15, the shape of the abrasive stone 63 is not so limited but may be a circular plate, or a cylindrical column which is smaller in length than the columnar stacked body 15, or a sphere.

It is noted that, although the columnar stacked body 15 is in principle shaped like a rectangular column, it may have the shape of a cylindrical column instead. In the case of the cylindrical column, the columnar stacked body can be shaped into a cylindrical column in the course of grinding process.

In the case where the columnar stacked body 15 is, at its opposite end faces 15a and 15b, held by the retainers 61a and 61b having a Vickers hardness Hv of 20 or more and 100 or less under a pressing force F of 10 MPa or more and 100 MPa or less, since the Vickers hardness of the retainers 61a and 61b is not so high, it follows that, in the retainers 61a and 61b in a state of holding the columnar stacked body 15, surfaces of the retainers 61a and 61b contacted with the end faces 15a and 15b of the columnar stacked body 15 become so deformed as to conform to the end faces 15a and 15b when pressed against the columnar stacked body 15. This makes it possible to hold the columnar stacked body 15 adequately without fail.

The abrasive stone 63 should preferably be made of diamond or the like material, and the speed of rotation thereof is adjusted to fall in a range of from about 2000 to 8000 rpm. Moreover, it is advisable that the columnar stacked body 15 is rotatable in the same direction as the rotational direction of the abrasive stone 63. In this case, the speed of rotation of the columnar stacked body 15 is adjusted to fall in a range of from about 80 to 150 rpm.

Figure 3:
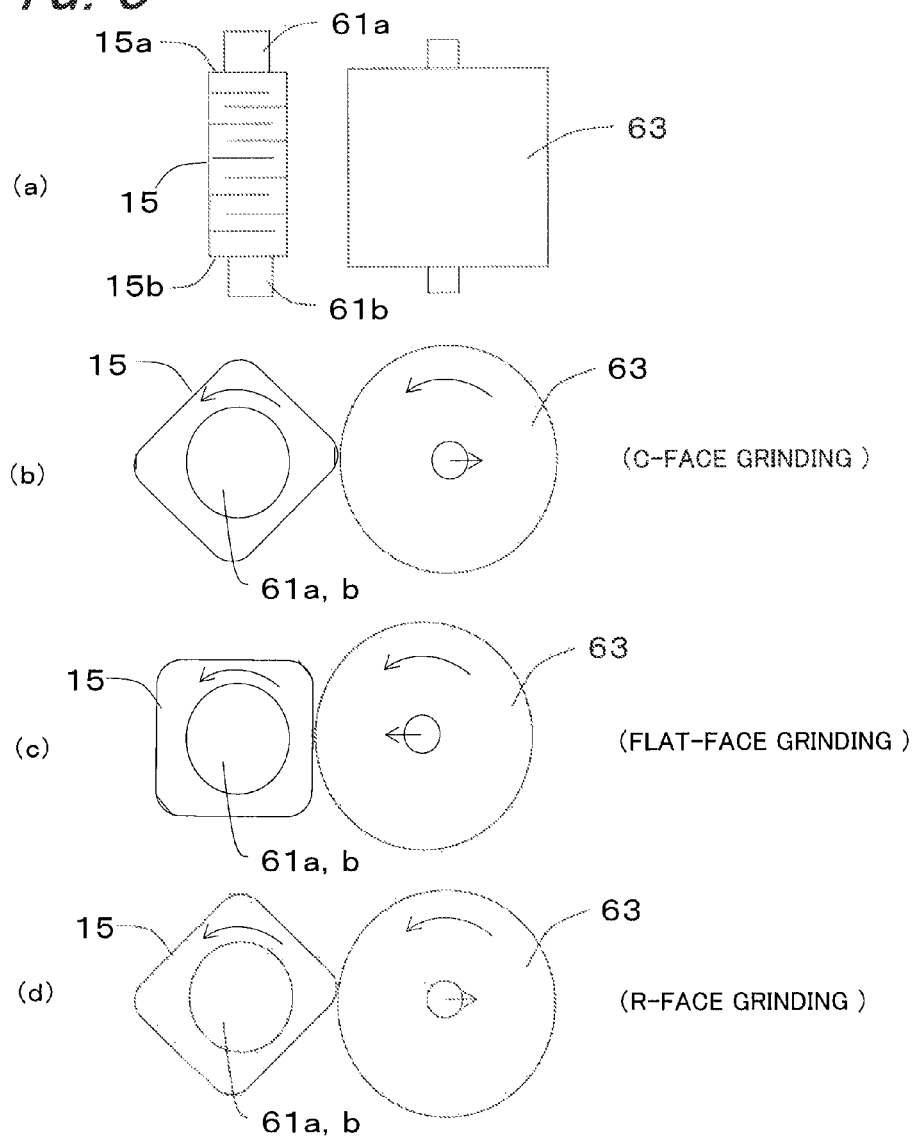
FIG. 3(a) is a schematic plan view showing each grinding step adopted in another example of the method for manufacturing the multi-layer piezoelectric element according to the embodiment of the invention.
FIGS. 3(b) to 3(d) are schematic vertical sectional views thereof.

Next, FIG. 3(a) is a schematic plan view showing each grinding process step adopted in another example of the method for manufacturing the multi-layer piezoelectric element according to the embodiment of the invention, and FIGS. 3(b) to 3(d) are schematic vertical sectional views thereof. In this example, the abrasive stone 63 serving as a grinding tool is mounted in movable relation toward and away from the side face of the columnar stacked body 15 in a rotating state for the sake of grinding the entire periphery of the columnar stacked body 15. That is, a rotary shaft of the cylindrical abrasive stone 63 is free to move back and forth relative to the side face of the columnar stacked body 15 in a rotating state. A mechanism for the back- and forth movement of the rotary shaft of the cylindrical abrasive stone 63 can be implemented for example by mounting a motor or the like connected to the rotary shaft for free movement in a direction perpendicular to the rotary shaft. Moreover, with the provision of a system capable of detection of a force transmitted from the columnar stacked body 15 to the rotary shaft of the columnar stacked body 15 (grinding pressure) by a pressure sensor or torquemeter attached to the motor, and also of control over the grinding pressure on the basis of a computer program, it is possible to allow the motor or the like connected to the rotary shaft to move in a direction perpendicular to the rotary shaft under a substantially uniform grinding pressure or a grinding pressure which changes in a predetermined curve.

Moreover, in order to leave grinding streaks of uniform depth on the entire periphery of the columnar stacked body 15, the following method is advisable for use.

The side faces of the columnar stacked body 15 are ground under the condition where the columnar stacked body 15 in itself remains still and unrotated, whereas the abrasive stone 63 is caused to rotate. Moreover, the rotary shaft of the abrasive stone 63 is made movable about the longitudinal axis of the columnar stacked body 15. In this way, the abrasive stone 63 is allowed to move about the longitudinal axis of the columnar stacked body 15 while rotating in its own. This makes it possible to grind the entire periphery of the columnar stacked body 15. In order for the rotary shaft of the abrasive stone 63 to move about the longitudinal axis of the columnar stacked body 15, it is advisable that, with consideration given to the radius of the abrasive stone 63, the rotary shaft of the abrasive stone 63 is controlled in movement under the computer program in advance so that it moves in conformity with the sectional configuration of the columnar stacked body 15. For example, it is desirable to control the movement of the rotary shaft of the abrasive stone 63 so that it travels the circumference of a rectangular region several times larger than the cross section of the columnar stacked body 15. This makes it possible to leave grinding streaks of uniform depth on the entire periphery of the columnar stacked body 15.

Moreover, as has already been described, under a uniform grinding pressure, it is possible to render the grinding streaks extending in parallel with the internal electrode layer 13 substantially uniform in depth throughout the whole side face of the columnar stacked body 15. As a result, occurrence of short-circuiting between the adjacent internal electrode layers 13 at the side face of the columnar stacked body 15 is effectively suppressed.

Further, in order to grind the columnar stacked body 15 at its whole side face by the abrasive stone 63 under a uniform pressure, it is preferable that the abrasive stone 63 is rotated at a speed in a range of 2000 rpm to 8000 rpm, and the columnar stacked body 15 is rotated at a speed in a range of 80 rpm to 150 rpm. In addition, it is preferable that the abrasive stone 63 has a diameter in a range of 200 mm to 400 mm.

As shown in the plan view of FIG. 3(a), the columnar stacked body 15 is, at its opposite end faces 15a and 15b, supported by the retainers 61a and 61b.

FIG. 3(b) is a vertical sectional view of the columnar stacked body 15 in a state of being pressed by the retainers 61a and 61b, illustrating how a ridge between the side faces of the columnar stacked body 15 is being chamfered by the abrasive stone 63 to form a C-face. At this time, as the ridge between the side faces of the columnar stacked body 15 is advanced toward the abrasive stone 63, the abrasive stone 63 is retracted correspondingly to perform chamfering.

FIG. 3(c) is a vertical sectional view showing the columnar stacked body 15 in a state of being ground at its side having a flat face. At this time, as the flat face of the columnar stacked body 15 is retracted away from the abrasive stone 63, the abrasive stone 63 is advanced toward the flat face correspondingly to perform grinding.

FIG. 3(d) is a vertical sectional view of the columnar stacked body 15 in a state of being pressed by the retainers 61a and 61b, illustrating how a ridge between the side faces of the columnar stacked body 15 is being rounded by the abrasive stone 63 to form an R-face. At this time, as the ridge between the side faces of the columnar stacked body 15 is advanced toward the abrasive stone 63, the abrasive stone 63 is retracted correspondingly to perform rounding.

By repeated cycles of the operations shown in FIGS. 3(b) and 3(c) or the operations shown in FIGS. 3(c) and 3(d), there is obtained the columnar stacked body 15 of predetermined shape having a desired side surface roughness. The columnar stacked body 15 has grinding streaks left on its entire periphery so as to extend in parallel with the internal electrode layer 13.

After that, external electrodes 17, taken as a pair, are formed on their respective side faces of the columnar stacked body 15 of the multi-layer piezoelectric element 1 for conduction with the internal electrode layers 13 having its ends left exposed. The external electrode 17 can be formed by adding a binder to silver powder and glass powder to prepare a silver-glass electrically conductive paste, printing the paste onto the side face of the columnar stacked body 15, and performing dry-bonding or baking treatment at a temperature in a range of 600° C. to 800° C.

Moreover, it is advisable to form, on the outer surface of the external electrode 17, an electrically conductive auxiliary member (not shown) made of an electrically conductive adhesive in which a metallic mesh or mesh-like metal plate is embedded. As used herein, the metallic mesh refers to a woven metal wires, and the mesh-like metal plate refers to a metal plate formed with pores in mesh form.

Next, a coating of resin is applied to the columnar stacked body 15 in the range from the center to the ends by immersing the columnar stacked body 15 formed with the external electrode 17 in a resin solution containing an outer-cladding resin material made of urethane resin, acrylic resin, epoxy resin, fluorine resin, ceramics, or silicone rubber, or by performing screen printing on the side faces of the columnar stacked body 15. Then, the resin coating is subjected to vacuum degassing treatment to cause the resin to adhere tightly to the asperities in the side faces of the columnar stacked body 15. In this way, the side faces of the columnar stacked body 15 are coated with the resin in the range from the center to the ends. Subsequently a lead wire acting as a current-carrying portion (not shown) is connected to the external electrode 17 by means of an electrically conductive adhesive (not shown) or otherwise.

Next, a direct-current electric field of 0.1 to 3 kV/mm is applied, via the lead wire, from the paired external electrodes 17 to the piezoelectric layer 11 through the internal electrode layers 13 to initiate polarization in the piezoelectric layer 11 of the columnar stacked body 15. In this way, the construction of the multi-layer piezoelectric element 1 is completed.

Then, the lead wire is connected to an external voltage supply section (not shown), so that a voltage can be applied to the piezoelectric layer 11 by the internal electrode layers 13 via the lead wire and the external electrode 17. This allows each of the piezoelectric layers 11 to undergo significant displacement under an inverse piezoelectric effect. Thus, the multi-layer piezoelectric element is capable of functioning as, for example, an automotive fuel injection valve mechanism (injection device) for the injection supply of fuel to an engine.

Figure 4:
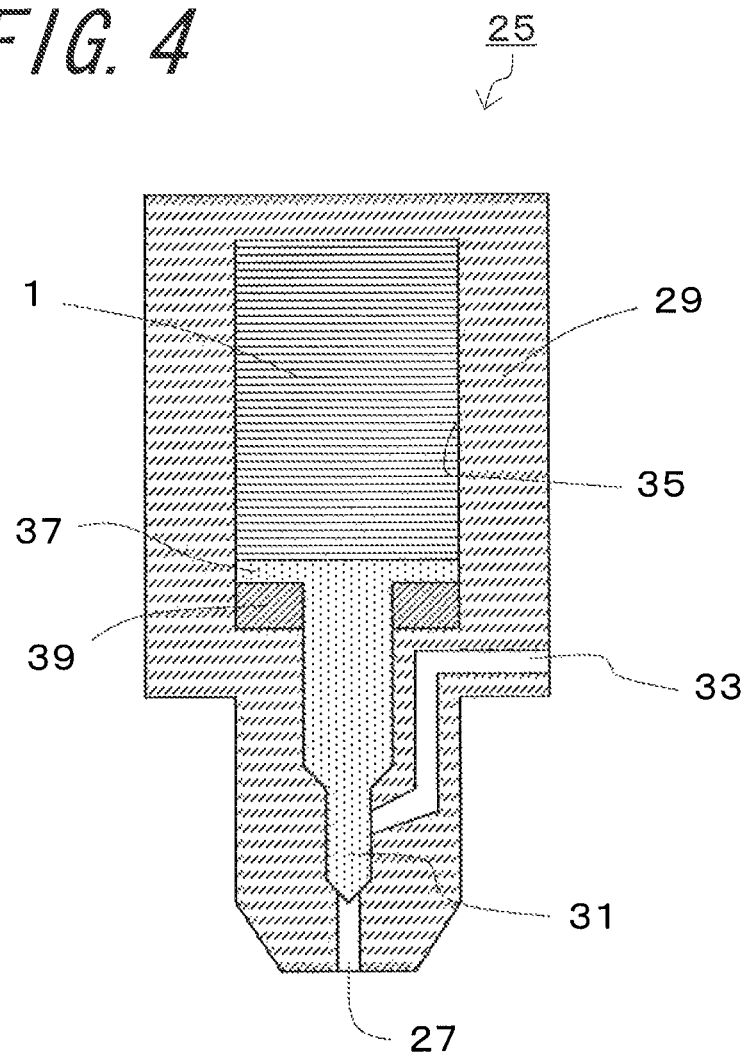
FIG. 4 is a schematic sectional view showing an example of an injection device according to an embodiment of the invention.

FIG. 4 is a schematic sectional view showing an example of an injection device according to an embodiment of the invention. As shown in FIG. 4, the injection device 25 according to this example comprises a container (housing) 29 comprising an injection hole 27 at one end thereof and the foregoing multi-layer piezoelectric element 1 of the example placed within the container 29. In an interior of the container 29 is disposed a needle valve 31 capable of opening and closing of the injection hole 27. A fuel passage 33 is so disposed as to be capable of communicating with the injection hole 27 in accordance with the movement of the needle valve 31. The fuel passage 33 is coupled to an external fuel supply source, so that a fuel is supplied to the fuel passage 33 under high pressure at all times. Therefore, when the needle valve 31 is operated to open the injection hole 27, then a fuel which has been fed through the fuel passage 33 is injected, through the injection hole 27, to a fuel chamber of an internal-combustion engine (not shown) under constant high pressure.

Moreover, an upper end of the needle valve 31 is a piston 37 having an inner diameter larger than that of the other portions, and this piston 37 is arranged so as to be slidable along the inner wall 35 of the cylindrical container 29. Furthermore, the foregoing multi-layer piezoelectric element 1 of the example is placed within the container 29.

In the injection device 25 thus constructed, upon extension of a piezoelectric actuator (multi-layer piezoelectric element 1) entailed by application of voltage, the piston 37 is pushed forward, thus causing the needle valve 31 to close the injection hole 27 with a consequent halt on supply of fuel. Moreover, upon stopping the application of voltage, the piezoelectric actuator (multi-layer piezoelectric element 1) is contracted, and a disc spring 39 pushes the piston 37 backward, thereby opening the fuel passage 33. In consequence, the injection hole 27 communicates with the fuel passage 33 so that injection of fuel is carried out.

Moreover, the injection device 25 of the example may comprise a container 29 comprising an injection hole 27 and the foregoing multi-layer piezoelectric element 1 of the example, wherein a liquid filled in the container 29 is configured to be injected through the injection hole 27 by driving the multi-layer piezoelectric element 1. That is, the multi-layer piezoelectric element 1 does not necessarily have to be placed within the container 29. It is essential only that a pressure for control of fluid injection is applied to the interior of the container 29 by driving the multi-layer piezoelectric element 1. It is noted that, examples of liquid include not only fuel and ink, but also various liquid fluid (such as a conductive paste).

FIG. 5 is a schematic block diagram showing an example of a fuel injection system according to an embodiment of the invention. As shown in FIG. 5, the fuel injection system 41 according to this example comprises a common rail 43 configured to store a high-pressure fuel, a plurality of the injection devices 25 according to the example configured to inject the high-pressure fuel stored in the common rail 43, a pressure pump 45 configured to supply the high-pressure fuel to the common rail 43, and an injection control unit 47 configured to send a drive signal to the injection devices 25.

The injection control unit 47 controls an amount of fuel to be injected and timing of fuel injection while monitoring the condition of the interior of an engine combustion chamber by means of a sensor or otherwise. The pressure pump 45 performs the function of feeding a fuel from a fuel tank 49 to the common rail 43 under pressure of about 1000 to 2000 atmospheres (about 101 MPa to about 203 MPa), preferably pressure of about 1500 to 1700 atmospheres (about 152 MPa to about 172 MPa). The common rail 43 stores the fuel fed thereto from the pressure pump 45 and feeds it to the injection device 25 as appropriate. As has already been described, the injection device 25 injects a small amount of fuel in fine-spray form into the combustion chamber from the injection hole 27.

It is to be understood that the application of the invention is not limited to the specific examples of the embodiment described heretofore, and that various changes and modifications can be made without departing from the spirit and scope of the invention. For example, the multi-layer piezoelectric element of the invention is applicable to a printing device for an ink-jet printer, a pressure sensor, and so forth, and the invention can therefore be carried into effect in any similar form so long as it is built as a piezoelectric element of multi-layer type which takes advantage of piezoelectric characteristics.

EXAMPLES

Hereinafter, examples of the multi-layer piezoelectric element of the invention will be described.

A piezoelectric actuator constructed of the multi-layer piezoelectric element 1 of the invention was fabricated as follows. Firstly, calcined powder of piezoelectric ceramics, a binder made of an acrylic organic polymer, and a plasticizer are mixed to prepare a slurry. The slurry was shaped into ceramic green sheets by the heretofore known doctor blade method. As the plasticizer, DBP (dibutyl phthalate) was used.

Next, an electrically conductive paste which is shaped into the internal electrode layer 13 was prepared by admixing a binder in metal powder of silver-palladium (Ag—Pd). The electrically conductive paste was printed onto the aforementioned ceramic green sheet in a predetermined pattern by means of screen printing. Then, a plurality of ceramic green sheets bearing the screen-printed electrically conductive paste were laminated on top of each other into a laminate, and a plurality of another ceramic green sheets were laminated on top of each other at each of the opposite ends of the laminate. In this way, a stacked compact was produced. A columnar stacked body 15 in which the piezoelectric layers 11 and the internal electrode layers 13 were alternately laminated was produced by firing the stacked compact.

At this time, the electrically conductive paste-printed ceramic green sheets were laminated on top of each other, and this laminate was dried into an unfired stacked compact. Then, a plurality of printed conductive paste-free ceramic green sheets were laminated on top of each other at each of the opposite ends of the unfired stacked compact in the stacked direction so as to form the inactive region 21. The unfired stacked compact could be cut into the desired shape on an as needed basis.

Next, the stacked compact was subjected to debinding treatment, or binder removal treatment at a predetermined temperature, and was whereafter fired at a temperature of 1000° C. In this way, the columnar stacked body 15 was produced.

Then, the side faces of the columnar stacked body 15 were ground. Note that samples for testing were built as follows. In Sample 1, an abrasive stone with abrasive grains having an average grain size of 40 μm was assigned to the side faces of each of the center and the ends of the columnar stacked body 15. In Samples 2 and 3, an abrasive stone with abrasive grains having an average grain size of 40 μm was assigned to the side faces of the center of the columnar stacked body 15, abrasive stones with abrasive grains having average grain sizes of 30 μm and 25 μm, respectively were assigned to the ends. In Samples 4 and 5, the abrasive stone assigned to each portion was of the same count (an average grain size of 30 μm) but different from each other in terms of the degree of cut depth. In Sample 6, the abrasive stone assigned to each portion is of the same count (an average grain size of 25 μm). Subsequently, in the manner as above described, each sample was subjected to repetition of cycles of the operations shown in FIGS. 3(b) through 3(d). In this way, there were produced columnar multilayer bodies 15 of predetermined shape each having a predetermined surface roughness of the side faces thereof. Each columnar stacked body 15 had grinding streaks left on its entire periphery so as to extend in parallel with the internal electrode layer 13.

After that, silver powder and glass powder were added in a binder to prepare a silver-glass electrically conductive paste. This paste was printed onto the side face of the columnar stacked body 15, followed by dry-bonding or baking treatment at a temperature in a range of 600° C. to 800° C. In this way, a pair of external electrodes 17 was formed.

Next, a coating of resin solution was applied to the columnar stacked body 15 formed with the external electrodes 17 by immersion in a resin solution containing an outer-cladding resin material made of epoxy resin, or by application of the resin solution by means of screen printing or otherwise. Subsequently the epoxy resin solution was subjected to vacuum degassing treatment to cause the epoxy resin to adhere tightly to the asperities at the side faces of the columnar stacked body 15. In this way, the side faces of the columnar stacked body 15 were coated with the resin in the range from the center to the ends. Then, a lead wire acting as a current-carrying portion was connected to each of the paired external electrodes 17 by an electrically conductive adhesive.

Next, a direct-current electric field of 0.1 to 3 kV/mm was applied, via the lead wire, from the paired external electrodes 17 to the piezoelectric layer 11 through the internal electrode layer 13 to initiate polarization in the piezoelectric layer 11 of the columnar stacked body 15. In this way, the construction of multi-layer piezoelectric elements 1 was completed.

Samples 1 to 6 thereby produced were subjected to comparative testing in accordance with the cross-cut tape method (prescribed in the specification of JIS K5400-8.5) for examination of the adherability of resin coating. In the testing, the resin coating of each sample was scratched, or cross-cut in a grid-like pattern by a cutter knife, whereafter a tape was adhered thereon and then peeled off. Based on the result of visual observation on resin-peeled states, Samples were graded as follows: a sample with the percentage of peeling-free area at 98% or above scored "8 points"; a sample with the percentage of peeling-free area at 95% or above scored "6 points"; a sample with the percentage of peeling-free area at 85% or above scored "4 points"; and a sample with the percentage of peeling-free area at 65% or above scored "2 points". The result of evaluation showed that a sample having a rough surface, being coated with a resin with higher sticking strength, suffers less from peeling of resin and therefore affords better resin adherability.

Moreover, in order to examine the condition of intrusion of water into the resin coating, a DC of 6 V was applied between the internal electrode layers 13 of each sample for 24 hours at a temperature of 35° C. and at a humidity of 90 RH %, and then the samples were left standing for 24 hours at room temperature. Subsequently measurement of leakage current was carried out. After weeding out a sample which was judged as defective due to the presence of leakage current, as durability testing, the remainder have been experimentally driven to operate continuously $1 \times 10^8$ times while applying alternate-current voltages ranging from 0 V to +160 V between the internal electrode layers 13 at room temperature and at a frequency of 150 Hz. The results of testing are listed in Table 1.

μm or less in terms of arithmetic average roughness Ra, the center of the columnar stacked body 15 suffered from peeling of resin and ensuing sparking during durability testing, which resulted in occurrence of leakage of current.

REFERENCE SIGNS LIST

1: Multi-layer piezoelectric element
11: Piezoelectric layer
13: Internal electrode layer
15: Columnar stacked body
15a, 15b: End faces
17: External electrode
61a, 61b: Retainer
63: Abrasive stone

The invention claimed is:

1. A multi-layer piezoelectric element, comprising:
a columnar stacked body in which piezoelectric layers and internal electrode layers are alternately laminated; and
a pair of external electrodes configured to bond to side faces of the columnar stacked body so as to make connection with the internal electrode layers,

TABLE 1

| Sample | Grain size of abrasive stone [average grain size] (μm) | | Grinding condition | Surface roughness [Ra] (μm) | | Cross-cutting in center | Leakage current | Durability test $1 \times 10^8$ cycles of |
|---|---|---|---|---|---|---|---|---|
| | Center | End | Depth of cut | Center | Opposite ends | Six stages | Present/Absent | driving operation |
| 1 | 40 | 40 | 75 | 0.5 | 0.5 | 8 points | Present | Canceled on account of presence of leakage current |
| 2 | 40 | 30 | 75 | 0.5 | 0.4 | 8 points | Absent | No problem |
| 3 | 40 | 25 | 75 | 0.5 | 0.3 | 8 points | Absent | No problem |
| 4 | 30 | 30 | 150 | 0.45 | 0.4 | 8 points | Absent | No problem |
| 5 | 30 | 30 | 75 | 0.4 | 0.4 | 6 points | Absent | Center suffered peeling that resulted in sparking |
| 6 | 25 | 25 | 75 | 0.3 | 0.3 | 2 points | Absent | Center suffered peeling that resulted in sparking |

As will be understood from the result shown in Table 1, in each of Samples 2 to 4 of the example of the invention in which the columnar stacked body 15 was so designed that the surface roughness of the center of the side face was greater than those of the ends thereof, the resin was coated with good adherability, and there was also no sign of leakage current after the durability testing.

More specifically, in Samples 2 to 4, the side face of the center of the columnar stacked body 15 had a surface roughness of 0.45 μm or more in terms of arithmetic average roughness Ra, and each of them scored 8 points in the cross-cut testing and thus proved to have good resin adherability. Moreover, as the result of leakage-current testing, each of Samples 2 to 4 was found to be free from leakage current even after the durability testing.

In contrast, in Sample 1 in which the center and the ends of the side face of the columnar stacked body 15 had the same surface roughness, namely a surface roughness of 0.5 μm in terms of arithmetic average roughness Ra, the resin adherability at the end was poor, and furthermore leakage of current took place due to the intrusion of water prior to durability testing.

In addition, in Samples 5 and 6 in which the center and the end of the side face of the columnar stacked body 15 had the same surface roughness, namely a surface roughness of 0.4 wherein a side face of the columnar stacked body is configured so that a surface roughness of a center of the side face in a stacked direction of the columnar stacked body is greater than those of ends of the side face in the stacked direction of the columnar stacked body, and
wherein the surface roughness of the side face becomes gradually finer from the center to the ends.

2. The multi-layer piezoelectric element according to claim 1, wherein the columnar stacked body comprises an active region located in the center in the stacked direction where each of the piezoelectric layers is sandwiched between the internal electrode layers, and an inactive region located in the ends where each of the piezoelectric layers is not sandwiched between the internal electrode layers, and the side face of the columnar stacked body is configured so that a surface roughness in the active region is greater than that in the inactive region.

3. The multi-layer piezoelectric element according to claim 1, wherein the columnar stacked body comprises processing streaks left on the center of the side face so as to extend in parallel with the piezoelectric layers and the internal electrode layers.

4. An injection device, comprising:
a container comprising an injection hole; and
the multi-layer piezoelectric element according to claim 1, wherein a liquid filled in the container is configured to be injected through the injection hole by driving the multi-layer piezoelectric element.

5. A fuel injection system, comprising:
a common rail configured to store a high-pressure fuel;
the injection device according to claim 4, configured to inject the high-pressure fuel stored in the common rail;
a pressure pump configured to supply the high-pressure fuel to the common rail; and
an injection control unit configured to send a drive signal to the injection device.

* * * * *